(12) United States Patent
Gilton et al.

(10) Patent No.: US 6,281,131 B1
(45) Date of Patent: *Aug. 28, 2001

(54) METHODS OF FORMING ELECTRICAL CONTACTS

(75) Inventors: Terry Gilton, Boise; Casey Kurth, Eagle; Russ Meyer; Phillip G. Wald, both of Boise, all of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/032,261

(22) Filed: Feb. 27, 1998

(51) Int. Cl.⁷ .................................................. H01L 21/302
(52) U.S. Cl. .......................... 438/705; 438/704; 438/753; 438/301; 438/303; 438/305
(58) Field of Search ..................................... 438/301, 303, 438/305, 308, 953, 705, 753, 723, 704, 696; 134/1.3

(56) References Cited

U.S. PATENT DOCUMENTS

| | | | |
|---|---|---|---|
| 4,704,783 | * 11/1987 | Possin et al. | 29/571 |
| 4,978,418 | * 12/1990 | Arnold, Jr. et al. | 156/628 |
| 5,441,599 | * 8/1995 | Reinhardt | 156/646.1 |
| 5,932,912 | * 8/1999 | Horita et al. | 257/336 |

FOREIGN PATENT DOCUMENTS

| | | |
|---|---|---|
| 09-074196 | * 3/1971 | (JP) . |
| 02-232925 | * 9/1990 | (JP) . |
| 02-295131 | * 12/1990 | (JP) . |
| 08-046209 | * 2/1996 | (JP) . |

* cited by examiner

Primary Examiner—Gregory Mills
Assistant Examiner—George Goudreau
(74) Attorney, Agent, or Firm—Wells, St. John, Roberts, Gregory & Matkin, P.S.

(57) ABSTRACT

A method of forming an electrical contact to semiconductive material includes forming an insulative layer over a contact area of semiconductive material. A contact opening is etched through the insulative layer to the semiconductive material contact area. Such etching changes an outer portion of the semiconductive material exposed by the etching. The change is typically in the form of modifying crystalline structure of only an outer portion from that existing prior to the etch. The changed outer portion of the semiconductive material is etched substantially selective relative to semiconductive material therebeneath which is unchanged. The preferred etching chemistry is a tetramethyl ammonium hydroxide solution. A conductive material within the contact opening is formed in electrical connection with the semiconductive material. In another aspect, the changed outer portion is etched with a basic solution regardless of selectivity in the etch relative to semiconductive material therebeneath which is unchanged by the contact opening etch. The preferred conductive material is conductively doped semiconductive material which is formed in the contact opening to be in contact with semiconductive material which is unchanged. Further, the conductive material within the contact opening is preferably void of any silicide material.

51 Claims, 6 Drawing Sheets

METHODS OF FORMING ELECTRICAL CONTACTS

TECHNICAL FIELD

This invention relates generally to methods of forming electrical contacts to semiconductive material.

BACKGROUND OF THE INVENTION

In semiconductor circuitry fabrication, electrical connections or contacts are commonly made between conductive lines and conductive diffusion areas formed within a semiconductive substrate. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Such electrical contacts are typically accomplished by initially etching a contact opening through insulative material over a conductive diffusion region comprising highly doped semiconductive material to which electrical connection is desired. Conductive material, such as conductively doped semiconductive material, is thereafter formed within the contact opening in electrical connection with the diffusion region within the semiconductive substrate. The conductive contact filling material can then either be planarized or, if deposited to a sufficient thickness, patterned into a conductive line or other desired electronic component.

Figure 1:
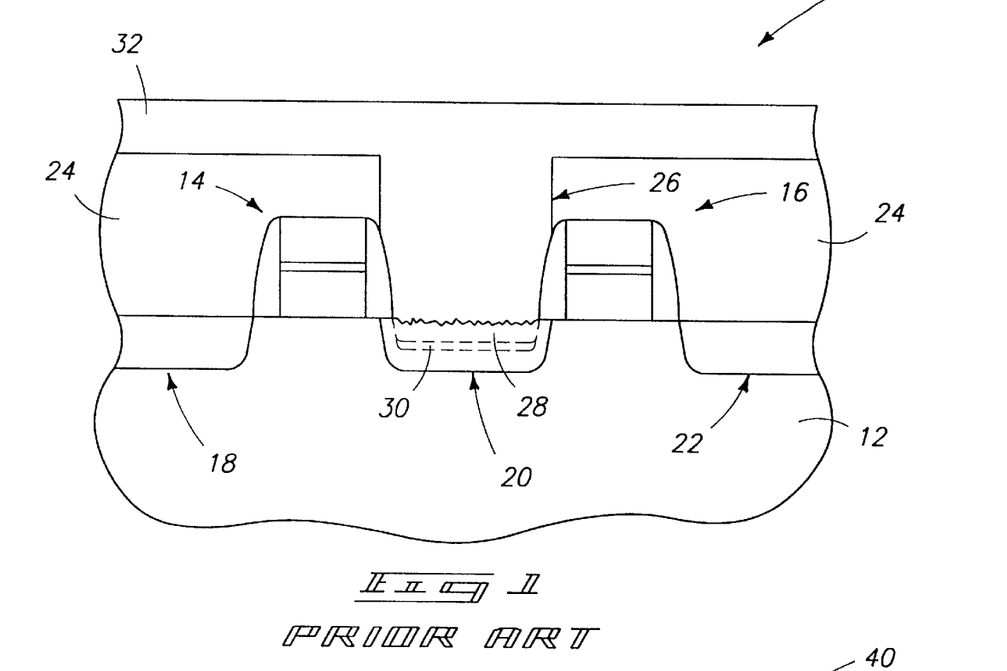
FIG. 1 is a cross-sectional view of a prior art semiconductor wafer fragment, and is discussed in the "Background" section above.

One problem associated with such connections is exemplified in FIG. 1. There illustrated is a semiconductor wafer fragment 10 comprised of a p– doped monocrystalline silicon substrate having a pair of conductive gate lines 14 and 16 formed thereover. Source/drain diffusion regions 18, 20, and 22, constituting n+ dopant, are formed within substrate 12 to form field effect transistors. In this example, electrical connection with an overlying conductive line is desired to be made with respect too diffusion region 20.

An insulating layer 24 is formed over substrate 12 and gates 14 and 16, and is subsequently planarized. A contact opening 26 is then patterned and formed, typically by dry etching, through insulating layer 24 over diffusion region 20. Such has the effect of roughening or otherwise damaging the outer surface of silicon substrate 12 within diffusion region 20 upon outward exposure thereof. This also undesirably has a tendency to change an outer portion 28 of the semiconductive material of substrate 12 exposed by the contact etching. This change typically manifests itself in a modified crystalline structure of the silicon material of substrate 12. Subsequently, a buried contact ion implant region 30 is formed into and through region 28 within diffusion region 20. Implant 30 is provided to achieve enhanced electrical contact between diffusion region 20 and a subsequently deposited conductive material. The substrate is typically subjected to an anneal in an attempt to repair or overcome the silicon damage caused by both the dry etch forming contact opening 26 and that caused by the implant to form region 30.

The wafer is subjected to an HF clean for a short period of time to clear any native oxide formed over region 20. A conductive layer 32 is then formed within contact opening 26 and over insulating layer 24, for example by depositing or otherwise forming a conductively doped semiconductive material such as polysilicon.

Unfortunately, the combined effect of both the changed outer portion 28 from the dry etch and the subsequent implant region 30, even with a subsequent anneal, forms a less than desired electrical connection between the diffusion region and conductive material 32, particularly where the conductive material within contact opening 26 is essentially void of any silicide material. It would be desirable to overcome some of these drawbacks associated with forming electrical contacts to semiconductive material.

SUMMARY OF INVENTION

In one aspect of the invention, a method of forming an electrical contact to semiconductive material includes forming an insulative layer over a contact area of semiconductive material. A contact opening is etched through the insulative layer to the semiconductive material contact area. Such etching changes an outer portion of the semiconductive material exposed by the etching. The change is typically in the form of modifying crystalline structure of only an outer portion from that existing prior to the etch. The changed outer portion of the semiconductive material is etched substantially selective relative to semiconductive material therebeneath which is unchanged. The preferred etching chemistry is a tetramethyl ammonium hydroxide solution. A conductive material within the contact opening is formed in electrical connection with the semiconductive material.

In another implementation, the changed outer portion is etched with a basic solution regardless of selectivity in the etch relative to semiconductive material therebeneath which is unchanged.

The preferred conductive material is conductively doped semiconductive material which is formed in the contact opening to be in contact with semiconductive material which is unchanged. Further, the conductive material within the contact opening is preferably void of any silicide material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
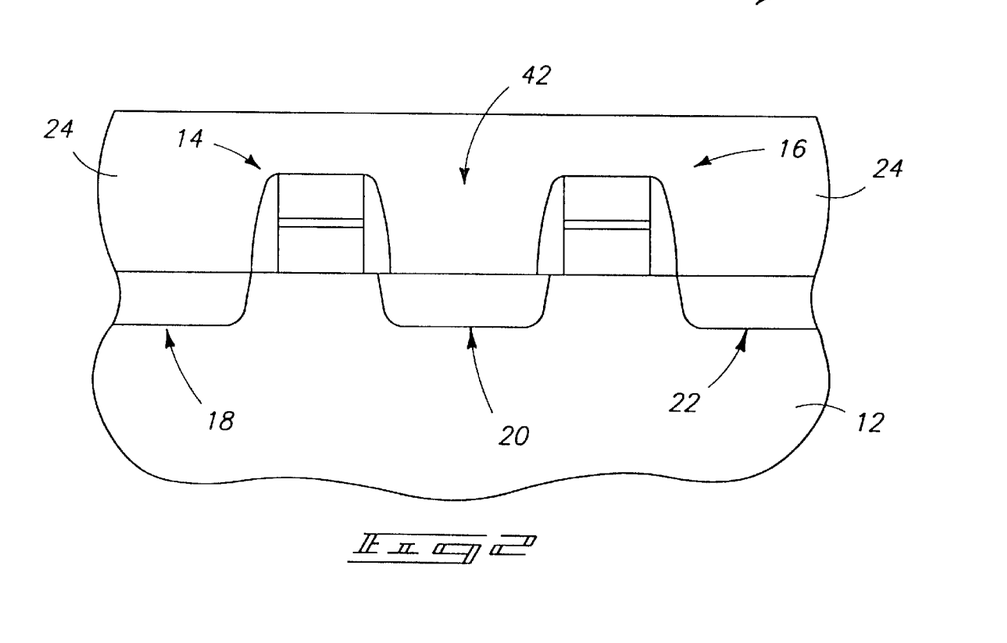
FIG. 2 is a cross-sectional view of a semiconductor wafer fragment at one process in accordance with the invention.

FIG. 2 illustrates a semiconductor wafer fragment 40 similar to the prior art depiction of FIG. 1. Like numerals have been utilized where appropriate, with differences being indicated with different numerals. Diffusion region 20 constitutes a contact area 42 of semiconductive material to which electrical contact is desired. Gates 14 and 16 are provided over substrate 12, with source/drain regions 18, 20 and 22 being formed within substrate 12, thus forming desired field effect transistors. Insulating layer 24 is formed over contact area 42 and the gates and diffusion regions of such field effect transistors.

Figure 3:
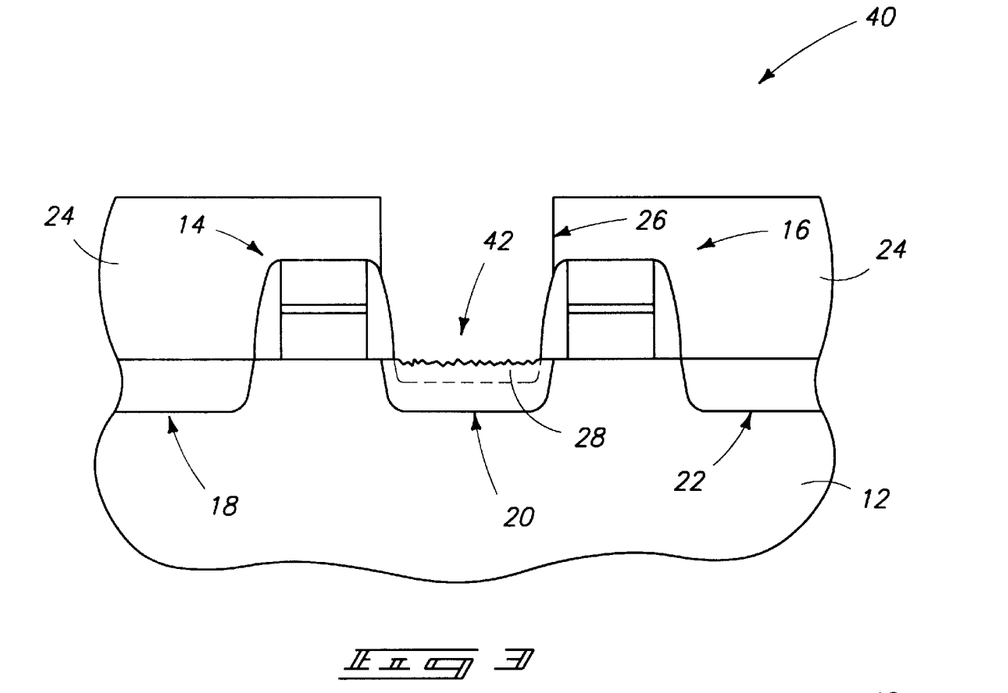
FIG. 3 is a view of the FIG. 2 wafer fragment at a processing step subsequent to that shown by FIG. 2.

Referring to FIG. 3, contact opening 26 is etched through insulating layer 24 to semiconductive material contact area 42, typically utilizing a suitable dry etch chemistry which is selective to etch silicon dioxide relative to underlying silicon. An example etch chemistry includes $C_2F_5H$, $CHF_3$, and $CH_2F_2$ in a plasma etcher. Such etching changes an outer portion 28 of the semiconductive material exposed by the contact etching, typically by undesirably modifying the crystal structure of the silicon lattice within substrate 12, which in this embodiment is an outer portion of source/drain diffusion region 20. Regardless and alternately considered in one implementation, outer portion 28 is provided to have a different crystalline structure than semiconductive material immediately therebeneath whether resulting from the etch, and whether occurring before or after such etch.

Figure 4:
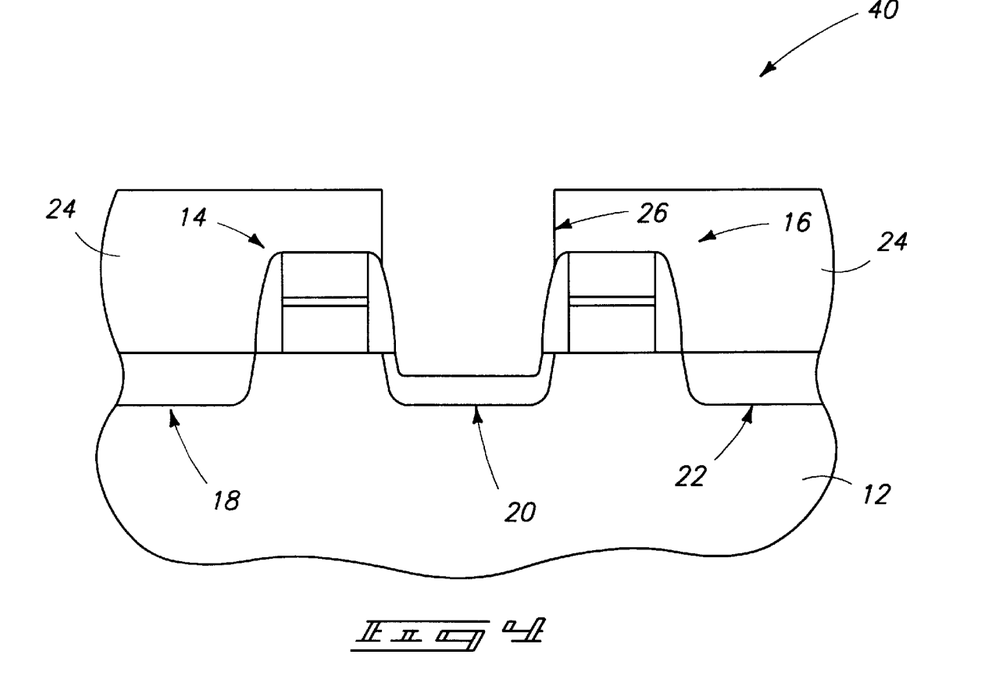
FIG. 4 is a view of the FIG. 2 wafer fragment at a processing step subsequent to that shown by FIG. 3.

Referring to FIG. 4, and in accordance with but one aspect of the invention, changed outer portion 28 is etched substantially selective relative to semiconductive material therebeneath of diffusion region 20 which is unchanged by the contact etching which formed opening 26. Such outer portion etching preferably comprises wet etching using, for example, a solution of tetramethyl ammonium hydroxide comprising from about 0.5% to 10% tetramethyl ammonium hydroxide by weight relative to deionized water. Pressure during etching is preferably ambient, with an example etching temperature being 30° C. In the context of this document, a substantially selective etch is defined by an etch which etches one material relative to another material at a removal rate of at least 2:1. Selectivity in this etch using the above example tetramethyl ammonium hydroxide solution wherein substrate 12 comprises monocrystalline silicon and diffusion region 20 constitutes phosphorus doping to a level of at least $1\times10^{20}$ ions/cm$^3$ is expected to be greater than or equal to 5:1.

In accordance with an alternate implementation, outer portion 28 is etched using some basic solution which etches outer portion 28 regardless of selectivity relative to underlying semiconductive material therebeneath. Regardless, preferably the etching of the changed outer portion is conducted to etch all exposed changed outer portion material. FIG. 4 illustrates outer portion 28 having been substantially removed from source/drain diffusion region 20 of semiconductive substrate 12.

Figure 5:
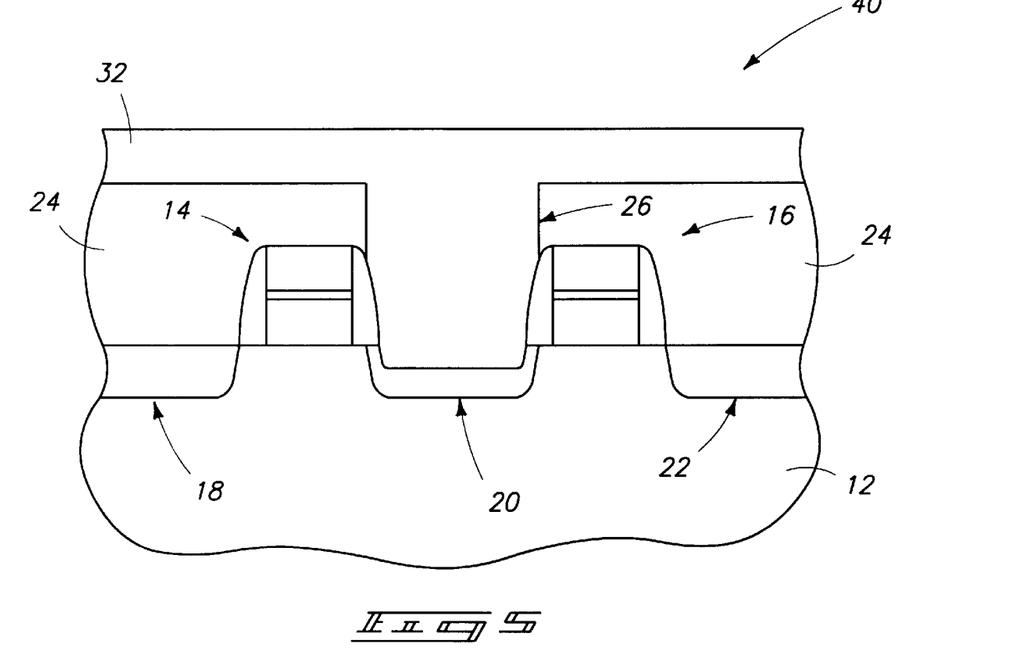
FIG. 5 is a view of the FIG. 2 wafer fragment at a processing step subsequent to that shown by FIG. 4

Referring to FIG. 5, conductive material 32 is formed within contact opening 26 in electrical connection with the semiconductive material of diffusion region 20. Such material preferably comprises polysilicon or some other semiconductive material conductively doped to a concentration of about $1\times10^{20}$ ions/cm$^3$. Contact opening 26 is thereby preferably formed to be void of any silicide, with material 32 being in contact with semiconductive material of diffusion region 20 which is unchanged from the contact etching.

Figure 6:
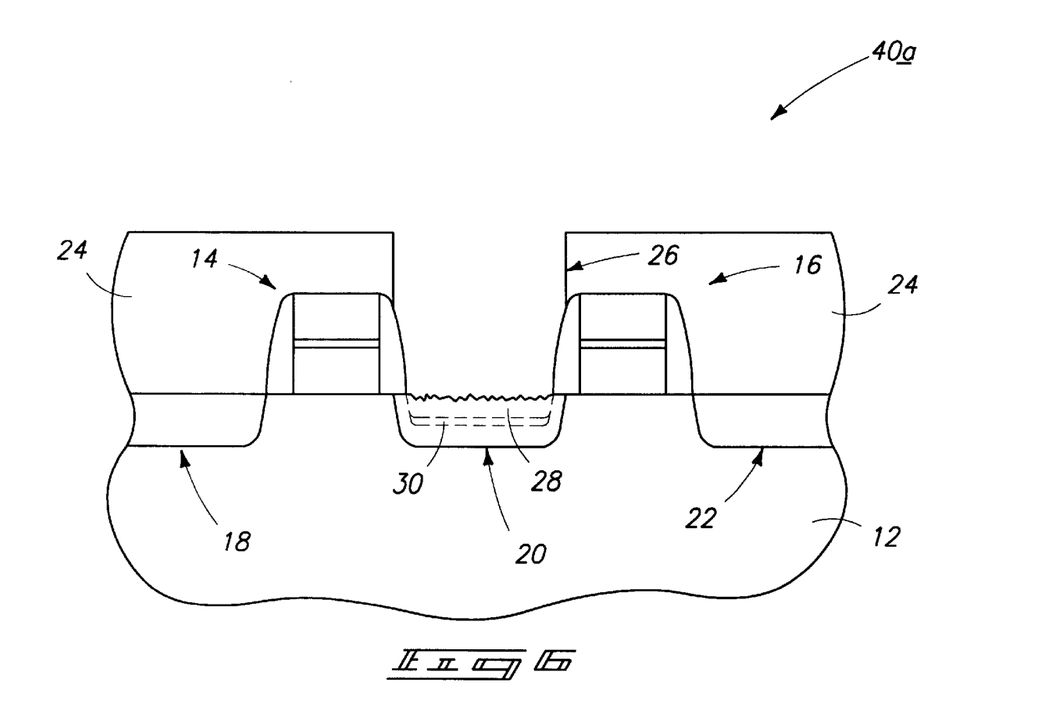
FIG. 6 is a diagrammatic cross-sectional view of an alternate semiconductor wafer fragment at an alternate processing step in accordance with the invention.
Figure 7:
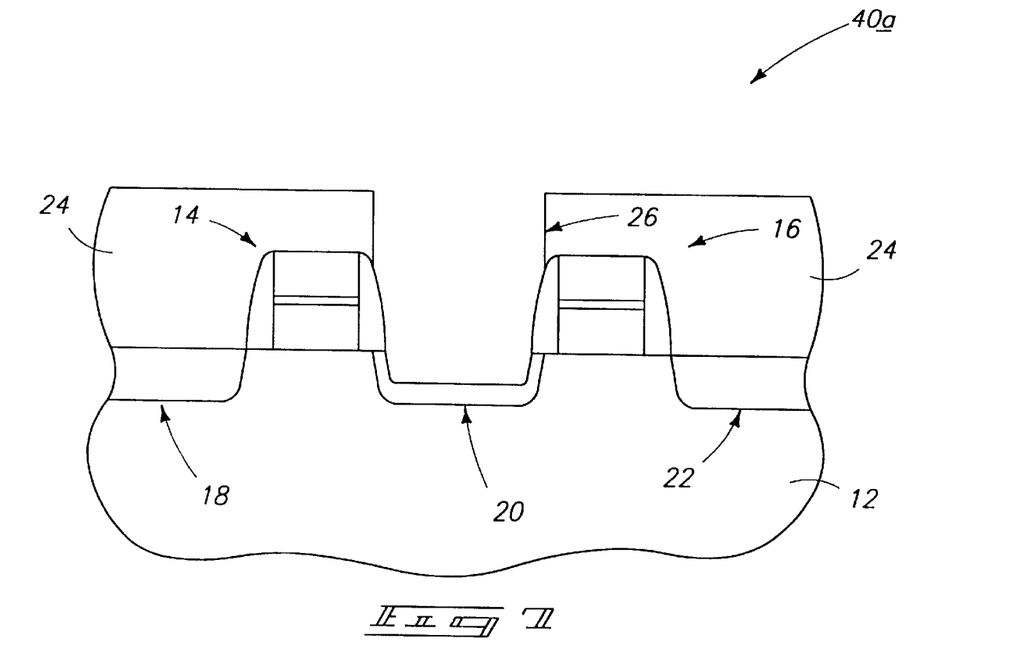
FIG. 7 is a view of the FIG. 6 wafer fragment at a processing step subsequent to that shown by FIG. 6.

An alternate preferred embodiment is described with reference to FIGS. 6–8. Like numerals from the FIGS. 2–5 embodiment are utilized where appropriate, with differences being indicated with different numerals or with the suffix "a". Wafer fragment 40a in FIG. 6 depicts wafer fragment 40 of the FIGS. 2–5 embodiment at a step immediately subsequent to that depicted by FIG. 3. Specifically, after contact opening 26 has been formed, a conductivity enhancing impurity is ion implanted into changed outer portion 28. An example implant is phosphorus at a dose of $9\times10^{12}$ atoms/cm$^2$ and energy of 80 keV. Region 30 is shown as having been implanted into and through region 28. Alternately, the implant could be conducted to be shallower, for example to substantially only place the implanted impurity into the changed outer portion. Further alternately, the implanting can be conducted to place the dopant concentration of the implant substantially central relative to the thickness or depth of region 28. Such latter implanting will focus most of the implant to within region 28, but perhaps not necessarily only place the impurity into the changed outer portion.

Regardless, such implanting further adversely modifies or changes the exposed semiconductive material such that selectivity in the subsequent etch utilizing at least the tetramethyl ammonium hydroxide solution can be substantially increased, such as to a selective etch ratio of 100:1. FIG. 7 illustrates such a subsequent etch removing material of regions 28 and 30 selectively relative to semiconductive material therebeneath of region 20 which is substantially unchanged by either of the contact opening 26 etch or the exemplary subsequent ion implant. An exemplary depth to the base of the source/drain diffusion regions is 2000 Angstroms, with an example depth to the base of region 30 being 1000 Angstroms. An example etch with a 2% by weight solution of tetramethyl ammonium hydroxide for 90 seconds at a temperature of 30° C. and ambient pressure produced a 1000 Angstroms selective removal of the damaged silicon to the base of region 30.

Figure 8:
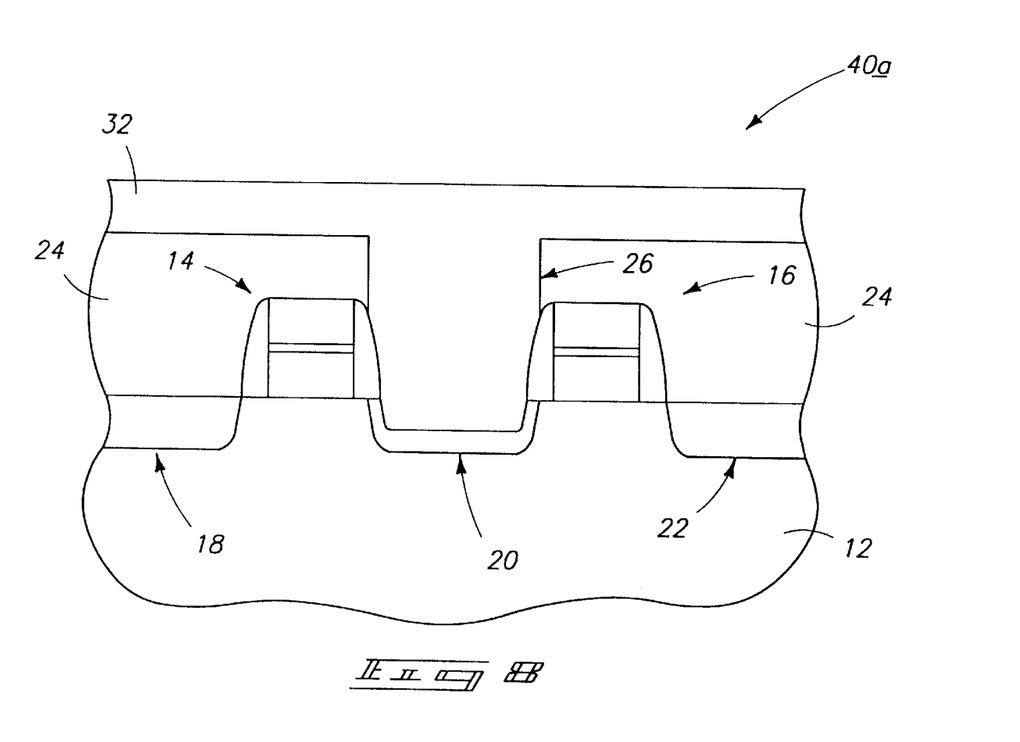
FIG. 8 is a view of the FIG. 6 wafer fragment at a processing step subsequent to that shown by FIG. 7.

Referring to FIG. 8, a conductive layer 32 is subsequently formed within and over contact opening 32 and ideally in contact with diffusion region 20.

Figure 9:
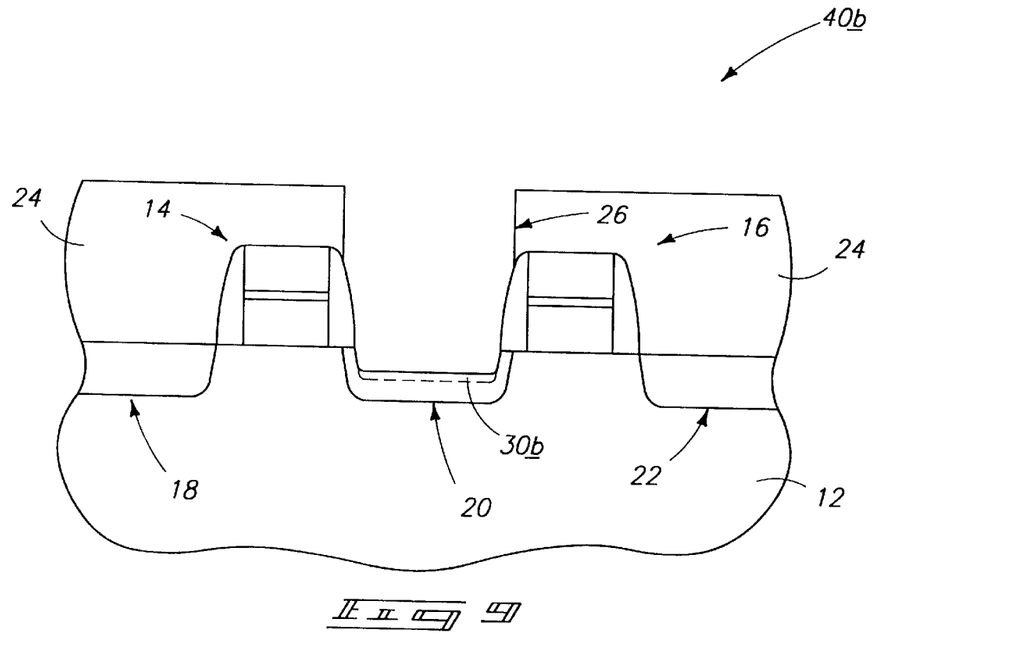
FIG. 9 is a diagrammatic cross-sectional view of another alternate embodiment semiconductor wafer fragment at another alternate processing step in accordance with the invention.

Another alternate embodiment is described with reference to FIGS. 9 and 10. Like numerals from the FIGS. 2–8 embodiments are utilized where appropriate, with differences being indicated by the suffix "b" or with different numerals. FIG. 9 illustrates a wafer fragment 40b at a processing step immediately subsequent to processing of wafer 40 as depicted in FIG. 4. In FIG. 9, a conductivity enhancing impurity has been implanted into semiconductive material of diffusion region 20 after having etched changed outer portion 28 to form region 30b. Such is ideally a shallow buried contact implant intended to enhance conductivity of the contact, like the implant 30 of the second described embodiment. Although the implant produced will have some effect in adversely modifying conductive properties of the silicon at the contact, such does not produce the double-damage effect in the contact of the prior art due to both remaining silicon damage from the dry etch to form the contact and a subsequent buried contact implant.

Figure 10:
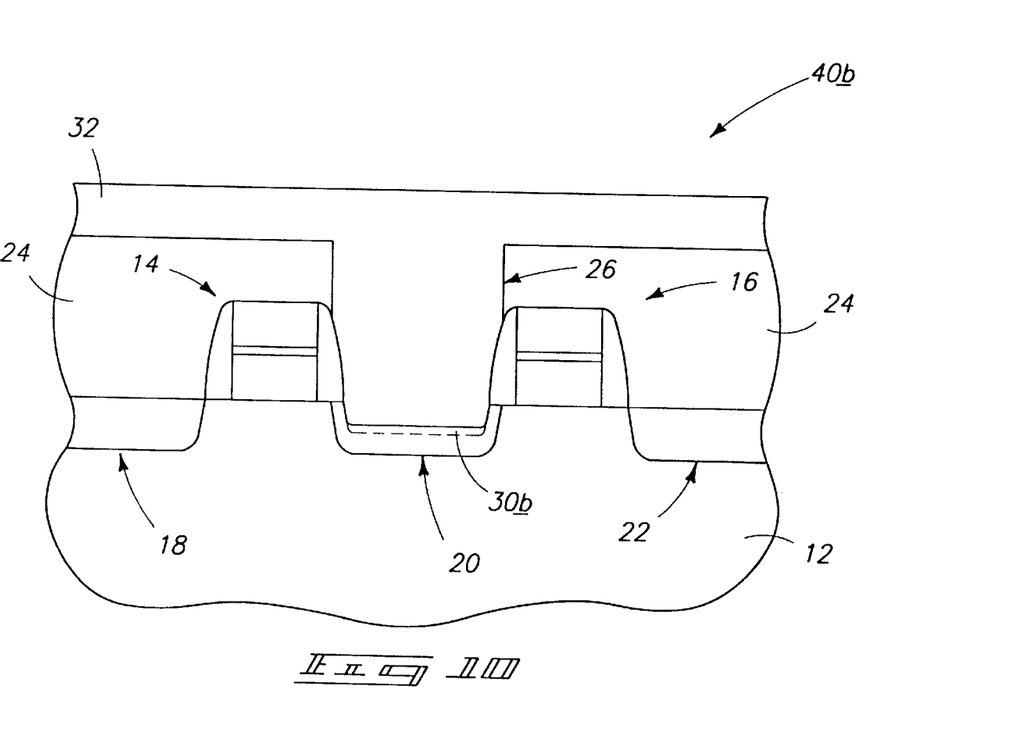
FIG. 10 is a view of the FIG. 9 wafer fragment at a processing step subsequent to that shown by FIG. 9.

Referring to FIG. 10, a conductive layer 32 is subsequently formed within and over contact opening 32 and ideally in contact with diffusion region 20.

Figure 11:
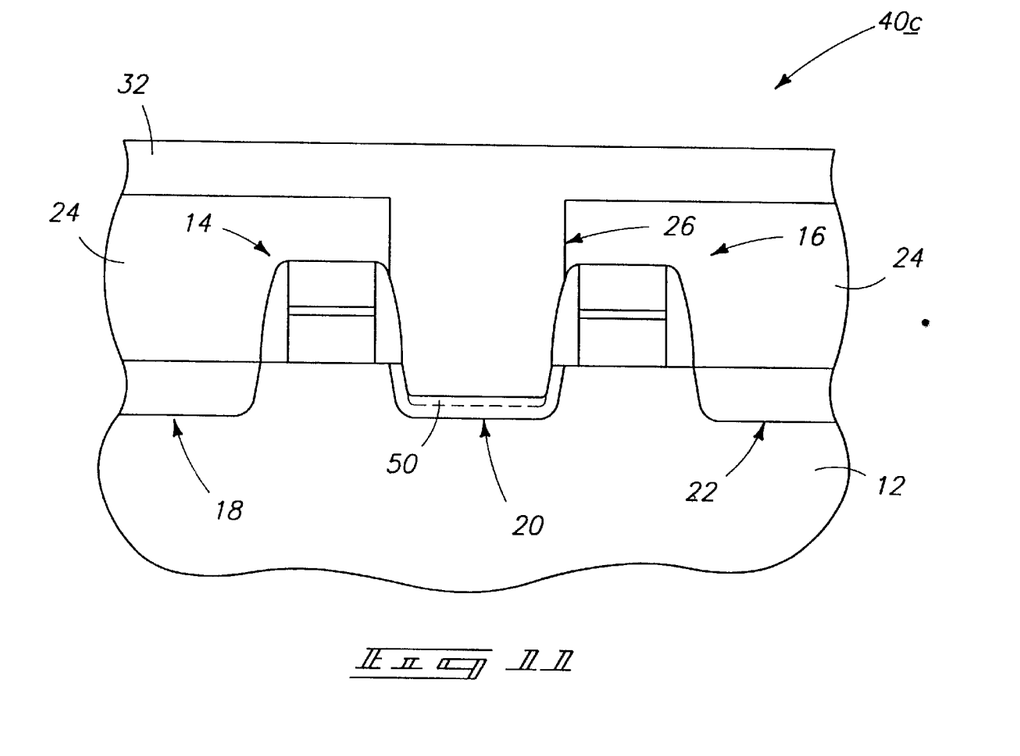
FIG. 11 is still another cross-sectional view of an alternate embodiment wafer fragment at an alternate processing step in accordance with the invention.

Yet another alternate embodiment is depicted in FIG. 11. Like numerals from the FIGS. 2–10 embodiments are utilized where appropriate, with differences being indicated with the suffix "c" or with different numerals. FIG. 11 depicts a wafer fragment 40c at a processing step immediately subsequent to that depicted with wafer 40a in FIG. 7. Accordingly, wafer fragment 40c has previously been processed by an ion implant immediately prior to etching the changed outer portion, ideally to enhance selectivity in the resulting etch of the damaged silicon relative to undamaged silicon therebeneath. Further in FIG. 11, a subsequent buried contact conductivity enhancing ion implant is conducted to form region 50 within diffusion region 20.

In compliance with the statute, the invention has been described language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an electrical contact to semiconductive material comprising:

forming a field effect transistor comprising a gate and comprising at least one source/drain region within a semiconductive substrate, the gate having a sidewall, and forming an insulative sidewall spacer over gate sidewall;

forming an insulative layer over the gate and the insulative sidewall spacer;

etching a contact opening through the insulative layer to the one source/drain region, said contact etching changing an outer portion of semiconductive material of the one source/drain region exposed by the contact etching;

etching the changed outer portion of the semiconductive material of the one source/drain region through the contact opening substantially selective relative to semiconductive material of the one source/drain region therebeneath which is unchanged; and after etching the changed outer portion, forming conductive material within the contact opening in electrical connection with semiconductive material of the one source/drain region.

2. The method of claim 1 wherein the outer portion etching comprises wet etching with a basic solution.

3. The method of claim 1 wherein the outer portion etching comprises wet etching with a tetramethyl ammonium hydroxide solution.

4. The method of claim 1 wherein the outer portion etching comprises wet etching with a tetramethyl ammonium hydroxide solution comprising from about 0.5% to 10% tetramethyl ammonium hydroxide by weight.

5. The method of claim 1 comprising forming the contact opening with all electrically conductive material therein to be void of silicide.

6. The method of claim 1 wherein the conductive material comprises conductively doped semiconductive material formed in contact with semiconductive material unchanged by said contact etching.

7. A method of forming an electrical contact to semiconductive material comprising:

forming an insulative layer over a contact area of semiconductive material;

etching a contact opening through the insulative layer to the semiconductive material contact area, said contact etching changing an outer portion of the semiconductive material exposed by the contact etching;

implanting a conductivity enhancing impurity into the changed outer portion;

after the implanting, etching the changed outer portion of the semiconductive material through the contact opening substantially selective relative to semiconductive material therebeneath which is unchanged; and forming conductively doped semiconductive material within the contact opening in contact with semiconductive material which is unchanged.

8. The method of claim 7 wherein the implanting is conducted to substantially only place the impurity into the changed outer portion.

9. The method of claim 7 wherein the changed outer portion has a thickness, and the implanting is conducted to place peak concentration of the implant substantially central relative to the thickness of the changed portion.

10. The method of claim 7 wherein the outer portion etching comprises wet etching with a basic solution.

11. The method of claim 7 wherein the outer portion etching comprises wet etching with a tetramethyl ammonium hydroxidde solution.

12. The method of claim 7 wherein the outer portion etching comprises wet etching with a tetramethyl ammonium hydroxide solution comprising from about 0.5% to 10% tetramethyl ammonium hydroxide by weight.

13. The method of claim 7 comprising forming the contact opening with all electrically conductive material therein to be void of silicide.

14. A method of forming an electrical contact to semiconductive material comprising:

forming an insulative layer over a contact area of semiconductive material;

etching a contact opening through the insulative layer to the semiconductive material contact area, said contact etching changing an outer portion of the semiconductive material exposed by the contact etching;

implanting a conductivity enhancing impurity into the changed outer portion;

after the implanting, etching the changed outer portion of the semiconductive material through the contact opening substantially selective relative to semiconductive material therebeneath which is unchanged;

after etching the changed outer portion, implanting a conductivity enhancing impurity into the semiconductive material; and forming conductively doped semiconductive material within the contact opening in contact with semiconductive material which is unchanged.

15. The method of claim 14 wherein etching of the changed outer portion is conducted to etch all exposed changed outer portion material.

16. The method of claim 14 wherein the etching of the changed outer portion is conducted using an etch chemistry which etches the changed outer portion selective to semiconductive material therebeneath which is unchanged, and etching such changed outer portion until said semiconductive material therebeneath which is unchanged is outwardly exposed.

17. The method of claim 14 wherein the touter portion etching comprises wet etching with a basic solution.

18. A method of forming an electrical contact to semiconductive material comprising:

forming a globally planarized insulative layer over a contact area of semiconductive material;

etching a contact opening through the insulative layer to the semiconductive material contact area to outwardly expose semiconductive material within the contact area;

providing an outer portion of the exposed semiconductive material within the contact area to have different crystalline structure than semiconductive material within the contact area immediately below the outer portion;

etching the outer portion of the semiconductive material with different crystalline structure through the contact opening substantially selective relative to the semiconductive material therebeneath of different crystalline structure; and forming conductive material within the contact opening in electrical connection with the semiconductive material.

19. The method of claim 18 wherein the outer portion etching comprises wet etching with a basic solution.

20. A method of forming an electrical contact to semiconductive material comprising:

forming an insulative layer over a contact area of semiconductive material;

etching a contact opening through the insulative layer to the semiconductive material contact area to outwardly expose semiconductive material within the contact area;

providing an outer portion of the exposed semiconductive material within the contact area to have different crystalline structure than semiconductive material within the contact area immediately below the outer portion;

wet etching the outer portion of the semiconductive material with different crystalline structure through the contact opening substantially selective relative to the semiconductive material therebeneath of different crystalline structure, the outer portion etching comprising wet etching with a tetramethyl ammonium hydroxide solution; and forming conductive material within the contact opening in electrical connection with the semiconductive material.

21. The method of claim 18 comprising forming the contact opening with all electrically conductive material therein to be void of silicide.

22. The method of claim 18 comprising after etching the outer portion, implanting a conductivity enhancing impurity into the semiconductive material.

23. A method of forming an electrical contact to semiconductive material comprising:

forming an insulative layer over a contact area of semiconductive material;

etching a contact opening through the insulative layer to the semiconductive material contact area to outwardly expose semiconductive material within the contact area;

providing an outer portion of the exposed semiconductive material within the contact area to have different crystalline structure than semiconductive material within the contact area immediately below the outer portion;

etching the outer portion of the semiconductive material with different crystalline structure through the contact opening substantially selective relative to the semiconductive material therebeneath of different crystalline structure;

forming conductive material within the contact opening in electrical connection with the semiconductive material; and further comprising after etching the insulative layer and before etching the outer portion, implanting a conductivity enhancing impurity into the semiconductive material.

24. A method of forming an electrical contact to semiconductive material comprising:

forming an insulative layer over a contact area of semiconductive material;

etching a contact opening through the insulative layer to the semiconductive material contact area to outwardly expose semiconductive material within the contact area;

providing an outer portion of the exposed semiconductive material within the contact area to have different crystalline structure than semiconductive material within the contact area immediately below the outer portion;

etching the outer portion of the semiconductive material with different crystalline structure through the contact opening substantially selective relative to the semiconductive material therebeneath of different crystalline structure;

forming conductive material within the contact opening in electrical connection with the semiconductive material;

further comprising after etching the insulative layer and before etching the outer portion, implanting a conductivity enhancing impurity into the semiconductive material; and after etching the outer portion, implanting a conductivity enhancing impurity into the semiconductive material.

25. The method of claim 23 wherein the outer portion etching comprises wet etching with a tetramethyl ammonium hydroxide solution.

26. The method of claim 24 wherein the outer portion etching comprises wet etching with a tetramethyl ammonium hydroxide solution.

27. A method of forming an electrical contact to semiconductive material comprising:

forming an electrically conductive device over a semiconductive substrate, the semiconductive substrate having a contact area proximate to the device;

forming a first insulative layer over at least a portion of the conductive device;

forming a second insulative layer over the first insulative layer and over the contact area;

etching a contact opening through the second insulative layer to the contact area, said contact etching changing an outer portion of semiconductive material within the contact area exposed by the contact etching;

etching the changed outer portion of the semiconductive material within the contact area through the contact opening substantially selective relative to semiconductive material within the contact area therebeneath which is unchanged; and after etching the changed outer portion, forming conductive material within the contact opening in electrical connection with semiconductive material of the contact area.

28. The method of claim 27 wherein the semiconductive material to which the conductive material within the contact opening ultimately electrically connects comprises a conductive diffusion region formed within the semiconductive substrate.

29. The method of claim 27 wherein the semiconductive material to which the conductive material within the contact opening ultimately electrically connects comprises a conductive diffusion region formed within the semiconductive substrate, the contact opening etched to the contact area being substantially centrally located relative to the diffusion region.

30. The method of claim 27 wherein the outer portion etching comprises wet etching with a basic solution.

31. The method of claim 27 wherein the outer portion etching comprises wet etching with a tetramethyl ammonium hydroxide solution.

32. The method of claim 27 wherein the outer portion etching comprises wet etching with a tetramethyl ammonium hydroxide solution comprising from about 0.5% to 10% tetramethyl ammonium hydroxide by weight.

33. The method of claim 27 comprising forming the contact opening with all electrically conductive material therein to be void of silicide.

34. The method of claim 27 wherein the conductive material comprises conductively doped semiconductive material formed in contact with semiconductive material unchanged by said contact etching.

35. A method of forming an electrical contact to semiconductive material comprising:
   forming an electrically conductive device over a semiconductive substrate, the semiconductive substrate having a contact area proximate to the device;
   forming a first insulative layer over at least a portion of the conductive device;
   forming a second insulative layer over the first insulative layer and over the contact area;
   etching a contact opening through the second insulative layer to the contact area, said contact etching changing an outer portion of semiconductive material within the contact area exposed by the contact etching;
   etching the changed outer portion of the semiconductive material within the contact area through the contact opening substantially selective relative to semiconductive material within the contact area therebeneath which is unchanged;
   after etching the changed outer portion, forming conductive material within the contact opening in electrical connection with semiconductive material of the contact area; and
   wherein the etching of the contact opening through the second insulative material is conducted substantially selective relative to the first insulative material.

36. A method of forming an electrical contact to semiconductive material comprising:
   forming a field effect transistor comprising a gate and comprising at least one source/drain region within a semiconductive substrate, the gate having a sidewall, and forming an insulative sidewall spacer over gate sidewall;
   forming an insulative layer over the gate and the insulative sidewall spacer;
   etching a contact opening through the insulative layer to the one source/drain region, said contact etching changing an outer portion of semiconductive material of the one source/drain region exposed by the contact etching;
   etching the changed outer portion of the semiconductive material of the one source/drain region through the contact opening substantially selective relative to semiconductive material of the one source/drain region therebeneath which is unchanged;
   after etching the changed outer portion, forming conductive material within the contact opening in electrical connection with semiconductive material of the one source/drain region; and
   wherein the etching of the contact opening exposes the insulative sidewall spacer.

37. A method of forming an electrical contact to semiconductive material comprising:
   forming an electrically conductive device over a semiconductive substrate, the semiconductive substrate having a contact area proximate to the device;
   forming a first insulative layer over at least a portion of the conductive device;
   forming a second insulative layer over the first insulative layer and over the contact area;
   etching a contact opening through the second insulative layer to the contact area, said contact etching changing an outer portion of semiconductive material within the contact area exposed by the contact etching;
   etching the changed outer portion of the semiconductive material within the contact area through the contact opening substantially selective relative to semiconductive material within the contact area therebeneath which is unchanged;
   after etching the changed outer portion, forming conductive material within the contact opening in electrical connection with semiconductive material of the contact area; and
   wherein the etching of the contact opening exposes the first insulative layer.

38. The method of claim 1 wherein the etching of the changed outer portion of the semiconductive material comprises wet etching.

39. The method of claim 7 wherein the etching of the changed outer portion of the semiconductive material comprises wet etching.

40. The method of claim 14 wherein the etching of the changed outer portion of the semiconductive material comprises wet etching.

41. The method of claim 18 wherein the etching of the changed outer portion of the semiconductive material comprises wet etching.

42. The method of claim 23 wherein the etching of the changed outer portion of the semiconductive material comprises wet etching.

43. The method of claim 24 wherein the etching of the changed outer portion of the semiconductive material comprises wet etching.

44. The method of claim 27 wherein the etching of the changed outer portion of the semiconductive material comprises wet etching.

45. The method of claim 1 wherein the insulative layer is formed to be globally planar prior to the contact opening etching.

46. The method of claim 7 wherein the insulative layer is formed to be globally planar prior to the contact opening etching.

47. The method of claim 14 wherein the insulative layer is formed to be globally planar prior to the contact opening etching.

48. The method of claim 20 wherein the insulative layer is formed to be globally planar prior to the contact opening etching.

49. The method of claim 23 wherein the insulative layer is formed to be globally planar prior to the contact opening etching.

50. The method of claim 24 wherein the insulative layer is formed to be globally planar prior to the contact opening etching.

51. The method of claim 27 wherein the second insulative layer is formed to be globally planar prior to the contact opening etching.

* * * * *

UNITED STATES PATENT AND TRADEMARK OFFICE
CERTIFICATE OF CORRECTION

PATENT NO.     : 6,281,131 B1                                                       Page 1 of 1
DATED          : August 28, 2001
INVENTOR(S)    : Terry L. Gilton et al.

It is certified that error appears in the above-identified patent and that said Letters Patent is hereby corrected as shown below:

<u>Column 6,</u>
Line 64, replace "touter" with -- outer --

Signed and Sealed this

Twelfth Day of March, 2002

Attest:

Attesting Officer

JAMES E. ROGAN
Director of the United States Patent and Trademark Office